(12) United States Patent
Lumpkin

(10) Patent No.: US 10,958,228 B2
(45) Date of Patent: Mar. 23, 2021

(54) DYNAMICALLY ADJUSTING COMMON MODE REJECTION RATIO

(71) Applicant: Polycom, Inc., San Jose, CA (US)

(72) Inventor: Jarrod Lumpkin, Marietta, GA (US)

(73) Assignee: Polycom, Inc., San Jose, CA (US)

( * ) Notice: Subject to any disclaimer, the term of this patent is extended or adjusted under 35 U.S.C. 154(b) by 0 days.

(21) Appl. No.: 16/451,966

(22) Filed: Jun. 25, 2019

(65) Prior Publication Data

US 2019/0393849 A1 Dec. 26, 2019

Related U.S. Application Data

(60) Provisional application No. 62/689,668, filed on Jun. 25, 2018.

(51) Int. Cl.
*H04R 3/00* (2006.01)
*H03F 3/45* (2006.01)
*H03G 3/30* (2006.01)

(52) U.S. Cl.
CPC ....... *H03F 3/45475* (2013.01); *H03G 3/3005* (2013.01); *H04R 3/00* (2013.01); *H03F 2200/03* (2013.01); *H03G 2201/103* (2013.01)

(58) Field of Classification Search
CPC .. H03F 2200/03; H03F 3/187; H03F 3/45475; H03F 3/45941; H03G 2201/103; H03G 3/3005; H04R 3/00
USPC .......... 381/56, 74, 107, 109, 120, 122, 123; 330/253, 256, 258, 259
See application file for complete search history.

(56) References Cited

U.S. PATENT DOCUMENTS

| | | | | |
|---|---|---|---|---|
| 5,732,143 | A * | 3/1998 | Andrea | G10K 11/178 381/71.6 |
| 6,002,299 | A | 12/1999 | Thomsen | |
| 9,496,835 | B2 * | 11/2016 | Creosteanu | H03F 1/0205 |
| 2009/0267693 | A1 * | 10/2009 | Chandra | H03F 3/45659 330/258 |
| 2011/0182442 | A1 * | 7/2011 | McDonald | H04H 60/04 381/109 |
| 2018/0219518 | A1 * | 8/2018 | Lee | A61B 5/0006 |
| 2020/0099352 | A1 * | 3/2020 | Chandrakumar | H03F 3/45928 |

OTHER PUBLICATIONS

Bill Whitlock of Jensen Transformers, Inc., "Design of High-Performance Balanced Audio Interfaces," date unknown, 18 pages.

* cited by examiner

*Primary Examiner* — Vivian C Chin
*Assistant Examiner* — Friedrich Fahnert
(74) *Attorney, Agent, or Firm* — Keith Lutsch, PC

(57) ABSTRACT

A circuit having a dynamically adjustable common mode rejection ratio. The circuit has a high common mode rejection ratio without the need for input transformers. The circuit's ability to adjust the circuit's common mode rejection ratio is enhanced by the circuit's high input impedance. The circuit includes first and second input terminals, and output terminals. A positive leg runs from the first input terminal to the first output terminal, the positive leg including a resistor, and a negative leg runs from an input terminal to an output terminal. The digital signal processor controls a potentiometer on one of the legs to dynamically adjust the common mode rejection ratio of the circuit.

20 Claims, 3 Drawing Sheets

DYNAMICALLY ADJUSTING COMMON MODE REJECTION RATIO

CROSS-REFERENCE TO RELATED APPLICATION

This application claims priority benefit of U.S. Provisional Application No. 62/689,668, which was filed on Jun. 25, 2018, and which is entirely incorporated by reference herein.

TECHNICAL FIELD

This disclosure relates to electronic audio systems, and more particularly to electronic audio systems having a high signal-to-noise ratio and a marginal common mode rejection ratio, without the need for transformers.

BACKGROUND

Conventionally, operational amplifiers have well-matched bipolar junction transistor or field effect transformer front ends and sufficiently high input impedance when operating in the Mega-ohm and Giga-ohm levels such that they achieve common mode rejection ratios (CMRR) exceeding ninety decibels (dB), that is CMRR>90 dB. However, in practice, external components are often needed on the front end of many instruments—such as operational amplifiers—to filter and shunt input bias currents. Thus, there is room for improvement in the art.

BRIEF DESCRIPTION OF THE DRAWINGS

For illustration, there are shown in the drawings certain examples described in the present disclosure. In the drawings, like numerals indicate like elements throughout. The full scope of the inventions disclosed herein are not limited to the precise arrangements, dimensions, and instruments shown. In the drawings.

DETAILED DESCRIPTION

Figure 1:
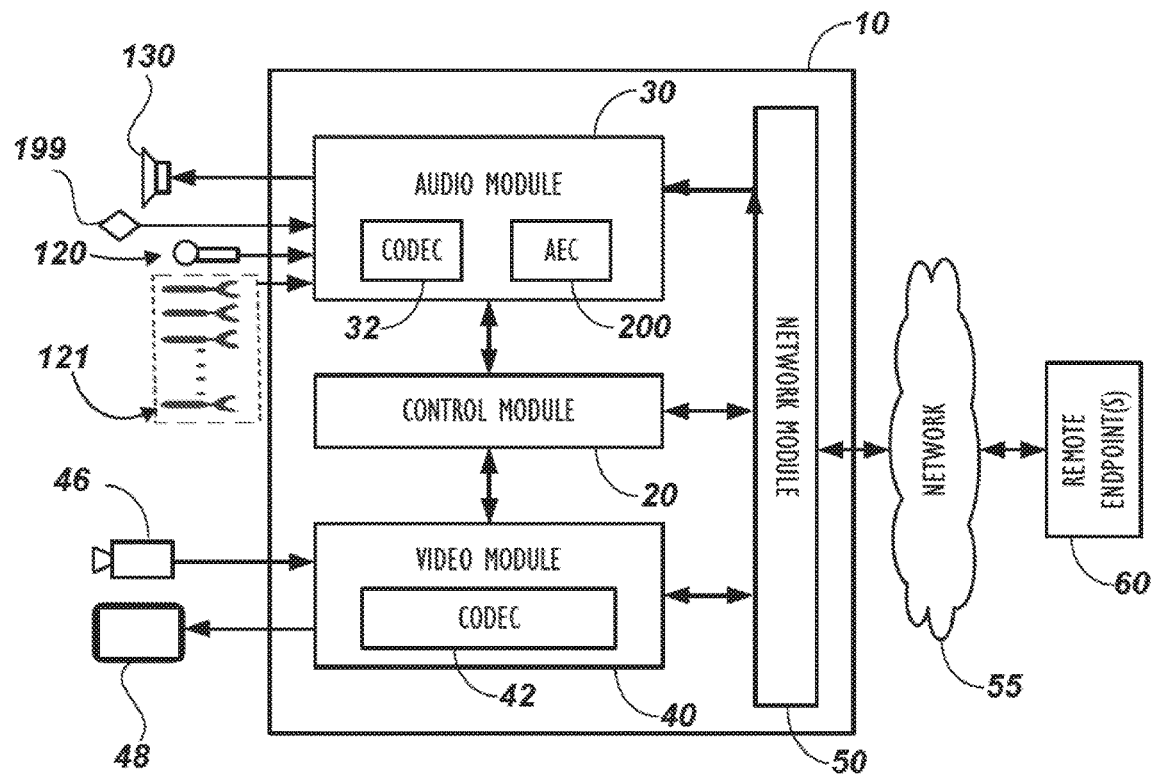
FIG. 1 illustrates an operational environment of one or more examples of this disclosure.

In the drawings and the description of the drawings herein, certain terminology is used for convenience only and is not to be taken as limiting the examples of the present disclosure. In the drawings and the description below, like numerals indicate like elements throughout.

Introduction

Some operational amplifiers have well-matched bipolar junction transistor or field effect transformer front ends and sufficiently high input impedance when operating in the Mega-ohm and Giga-ohm levels such that they achieve common mode rejection ratios (CMRR) exceeding ninety decibels (dB), that is CMRR>90 dB. However, in practice, external components are often needed on the front end of many instruments—such as operational amplifiers—to filter and shunt input bias currents. Most operational amplifiers need a resistive path to ground for the bias currents. This in turn creates a differential offset direct current (DC) voltage that can affect the both the CMRR and the operational amplifier performance, especially when operating at high gain. Although DC offset voltages can usually be cancelled by (alternating current) AC coupling the downstream operational amplifiers, the precision of the resistors and coupling capacitors in such circuits, while solving one problem can create another, which is the conversion of common mode input signals to differential due to the error between each leg of the input. Examples of this disclosure address one or more of these issues.

The common mode rejection ratio (CMRR) of a device, such as a differential amplifier (or other device) is a metric used to quantify the ability of the device to reject common mode signals. Common mode signals appear simultaneously and in-phase on both device inputs. An ideal differential amplifier would have infinite CMRR, however this is not achievable in practice. A high CMRR is required when a differential signal must be amplified in the presence of a possibly large common mode input.

Ideally, a differential amplifier takes the voltages, $V^+$ and $V^-$ on its two inputs and produces an output voltage $V_o = A_d((V^+)-(V^-))$, where $A_d$ is the differential gain. However, the output of a real differential amplifier is better described as:

$$V_o = A_d((V^+)-(V^-)) + 1/2 A_{cm}[A_d((V^+)-(V^-))] \quad \text{(eq. 1)}$$

where $A_{cm}$ is the common mode gain, which is typically much smaller than the differential gain. The CMRR is defined as the ratio of the powers of the differential gain over the common mode gain, measured in positive decibels (thus using the 20 logarithm rule):

$$CMRR = (A_d/|A_{cm}|) = 10 \log_{10}(A_d/A_{cm})^2 \text{ dB} = 20 \log_{10}(A_d/|A_{cm}|) \text{dB} \quad \text{(eq. 2)}$$

Discussion

Most modern electronic audio products do not include input transformers due to their size and cost. The downside of not including input transformers is that the input common mode rejection ratio (CMRR) is (often significantly) lowered because most audio circuits lack the precision which would enable them to match the CMRR of a transformer. It is not uncommon to be able to achieve a CMRR which exceeds 90 dB for a 60 hertz (Hz) signal with a transformer. Whereas in typical audio equipment not using a balancing transformer, a CMRR of about 55-60 dB for a 60 Hz signal is more common.

An adequately high CMRR is important in circuit design, because one of the benefits of a balanced circuit is the ability to provide a path for any surrounding magnetic and electrical noise to couple into a positive and a negative signal conductor such that the superposition of this noise onto both signal conductors (common mode) can be cancelled inside the audio receiver. Thus, while the noise is present, the noise does not affect the operation of the circuit or the quality of its output signal. A receiver's ability to cancel common mode signals can be important if the receiver has the ability to add gain to the signal. Most analog microphones require about 30-50 dB of gain to operate effectively, and some of the noise that is superimposed onto the connecting cables for such microphones contains frequencies that are related to the power inputs; that is, noise in the 50-60 Hz range and associated harmonics. Depending on the amount of gain of the audio receiver circuit, those frequencies and harmonics can become audible, which is undesirable.

As noted, conventionally, the best CMRR that audio circuits can achieve—in the absence of transformers—is 55-60 dB. This functional upper limit on CMRR is generally due to component tolerance and cable imbalances that are too high for the typical 1-10 kilo-ohm input impedances of such circuits. To address these shortcomings, at least one example of this disclosure includes an audio circuit with a high input impedance (e.g., 1 Mega-ohm) and a digital potentiometer at the negative leg of the input terminals. The high input impedance serves to minimize component and cable (signal) imbalance, while the digital potentiometer enables the circuit to be (dynamically) fine-tuned to counteract component imbalances.

In at least one example of this disclosure, the digital potentiometer is controlled in the following manner. Analog switches, such as those that can be used to provide test coverage for a respective audio port, are configured to enable the output of the circuit to loopback into the input ports such that a known stimulus can be generated using a Digital Signal Processor (DSP). The known stimulus is then converted into an analog signal using a Digital-to-Analog Converter (DAC). This analog stimulus is then input to the analog input circuit (via the analog switches), and quantized using the Analog-to-Digital Converter (ADC). The output of the ADC is then connected to a DSP (which can be the same DSP mentioned above), which performs a Fast Fourier Transform (FFT) to analyze the input (digitized output of ADC) bit-stream to determine the common mode amplitudes of the known stimulus signal. Those common mode amplitudes are processed by the DSP and, based on the determined common mode amplitudes, the DSP adjusts the digital potentiometer so as to maximize the CMRR of the circuit by applying small resistive gains to the circuit to offset the circuit's internal component tolerances. These small changes to the resistive gain lower the amplitudes of the common mode stimulus, such that the system's minima CMRR values can be determined. Controlling the digital potentiometer enables the common mode rejection ratio of the circuit to be tuned dynamically, based on (and to compensate for) variations associated with circuit components, (such as those due to component tolerances and temperatures). Thus, the CMRR of a given circuit, (e.g., an operational amplifier), can be dynamically adjusted by the circuit itself, making the CMRR essentially self-correcting.

In at least one example of this disclosure, to offset the wiper resistance of the digital potentiometer described above, and to provide sufficient resolution in making changes to the digital potentiometer, the positive leg of the circuit includes a resistive offset. The resistive value of the offset can be modified depending on the circumstances because the effect of the offset resistor is generally minimized by the high input impedance of the circuit. Thus, adjustments to the potentiometer can strictly be isolated to performing an internal loopback to achieve a successful improvement (increase) in CMRR.

In at least one example of this disclosure, the high input impedance and digital potentiometer configured as described, allow a circuit to realize a common mode rejection ratio of 90-100 dB when operating in the 60 Hz range. Thus, the performance of the circuit compares favorably to that expected when a transformer is used. Additionally, in at least one example, the use of the digital potentiometer allows for a much greater reduction in shield current induced noise (SCIN), which itself greatly affects the CMRR of the circuit, (especially when input impedances are less than 100 kilo-ohm).

Aspects of this application pertain to operation and construction of analog circuits. General tolerance of resistors of about 1% is common. While it is possible to purchase resistors with higher tolerance levels, this tends to be costly. Consequently, when constructing microphone pre-amps, for example, off the shelf components are used. However, it is not practical to put a super-high input impedance across the amp because the bias current that the higher tolerance level components (such as resistors) create, in combination with the high input impedance itself, causes the offset voltages to the input operational amplifier to be extremely high. Consequently, the output of the operational amplifier can become saturated to the rail, making the circuit in question unusable.

Examples of this disclosures pertain to operational amplifiers that do not include input transformers, such as due to size and/or cost. In the absence of other instrumentations, the common mode rejection ratio (CMRR) of an input signal is sacrificed because most audio circuits lack the precision to match the CMRR of a transformer. One can usually achieve >90 dB at 60 Hz with a transformer compared to 55-60 dB at 60 Hz with a typical pro audio product. As noted, CMRR is important because one of the benefits of a balanced circuit its ability to provide a path for any surrounding magnetic and electrical noise to couple into a positive and a negative signal conductor such that the superposition of this noise onto both signal conductors (common mode) can be cancelled. The importance of the receiver's ability to cancel common mode signals becomes paramount if the receiver has the ability to add gain to the signal. Most analog microphones require 30-50 dB of gain. An often some of the noise that is superimposed onto the connecting cables of a receiver circuit contains frequencies that are power-line driven (i.e. 50-60 Hz and associated harmonics). These frequencies can translate into (unwanted) audible sound if a given audio receiver has a high enough gain.

FIG. 1 illustrates a possible operational environment for example circuits of this disclosure. Specifically, FIG. 1 illustrates a conferencing apparatus or endpoint 10 in accordance with an example of this disclosure. Conferencing apparatus or endpoint 10 of FIG. 1 communicates with one or more remote endpoints 60 over a network 55. The endpoint 10 includes an audio module 30 with an audio codec 32, and a video module 40 with a video codec 42. These modules 30/40 operatively couple to a control module 20 and a network module 50. In implementations of the technology which only involve audio communication, video module 40 with a video codec 42 can be omitted.

A microphone 120 captures audio and provides the audio to the audio module 30 and codec 32 for processing. The microphone 120 can be a table or ceiling microphone, a part of a microphone pod, an integral microphone to the endpoint, or the like. Additional microphones 121 can also be provided. Throughout this disclosure all descriptions relating to microphone 120 apply to any additional microphones 121, unless otherwise indicated. The endpoint 10 uses the audio captured with the microphone 120 primarily for the conference audio. In general, the endpoint 10 can be a conferencing device, a videoconferencing device, a personal computer with audio or video conferencing abilities, or any similar type of communication device. If the endpoint 10 is used for videoconferencing, a camera 46 captures video and provides the captured video to the video module 40 and codec 42 for processing.

After capturing audio and video, the endpoint 10 encodes it using any of the common encoding standards, such as MPEG-1, MPEG-2, MPEG-4, H.261, H.263 and H.264.

Then, the network module 50 outputs the encoded audio and video to the remote endpoints 60 via the network 55 using any appropriate protocol. Similarly, the network module 50 receives conference audio and video via the network 55 from the remote endpoints 60 and sends these to their respective codec 32/42 for processing. Eventually, a loudspeaker 130 outputs conference audio (received from a remote endpoint), and a display 48 can output conference video. The endpoint 10 includes a distortion detection module 199 for detecting distortion that may be introduced when the loudspeaker 130 outputs audio.

The endpoint 10 further includes an acoustic echo cancellation module 200 that reduces acoustic echo. Acoustic echo results from far-end audio output by the loudspeaker 130 being subsequently picked up by the local microphone 120, reprocessed, and sent back to the far-end. Additional microphones 121 can operate by the same principle. The acoustic echo cancellation module (200) can be based on acoustic echo cancellation techniques known and used in the art to reduce or eliminate this form of echo.

Figure 2:
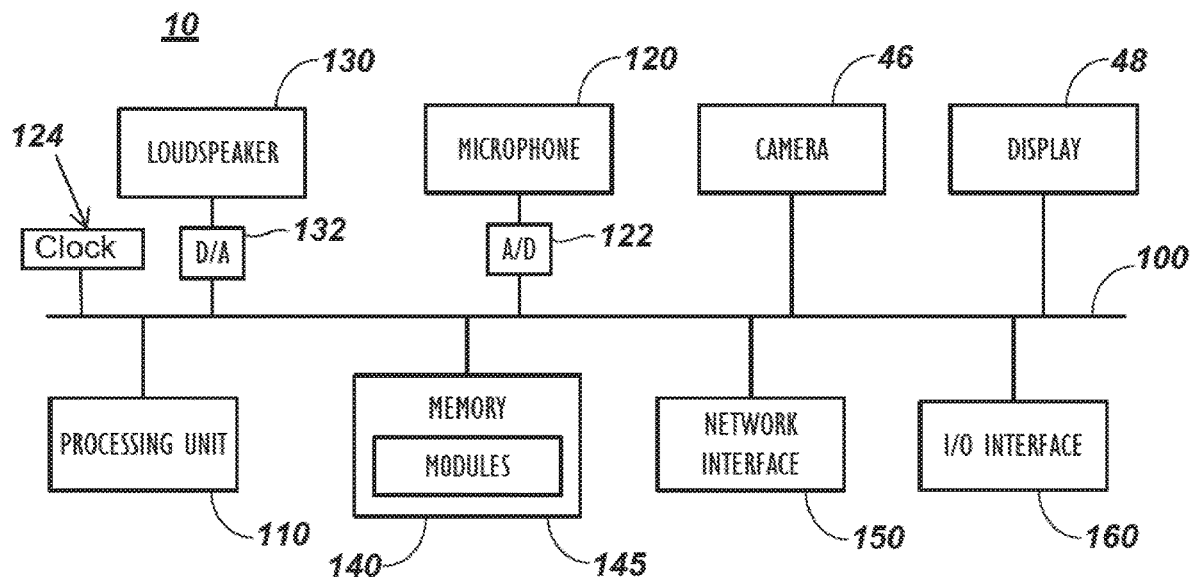
FIG. 2 illustrates components of the operational environment of FIG. 1.

FIG. 2 illustrates components of the conferencing endpoint of FIG. 1 in detail. The endpoint 10 has a processing unit 110, memory 140, a network interface 150, and a general input/output (I/O) interface 160 coupled via a bus 100. As above, the endpoint 10 has the base microphone 120 and loudspeaker 130 and can have the video components of a camera 46 and a display 48 if desired.

The memory 140 can be any conventional memory such as SDRAM and can store modules 145 in the form of software and firmware for controlling the endpoint 10. The stored modules 145 include the various video and audio codecs 32/42 and other modules 20/30/40/50/200 discussed previously. Moreover, the modules 145 can include operating systems, a graphical user interface (GUI) that enables users to control the endpoint 10, and other algorithms for processing audio/video signals.

The network interface 150 provides communications between the endpoint 10 and remote endpoints (60). By contrast, the general I/O interface 160 can provide data transmission with local devices such as a keyboard, mouse, printer, overhead projector, display, external loudspeakers, additional cameras, microphones, etc.

During operation, the loudspeaker 130 outputs audio in the conference environment. For example, this output audio can include far-end audio received from remote endpoints via the network interface 150 and processed with the processing unit 110 using the appropriate modules 145. At the same time, the microphone 120 captures audio in the conference environment and produces audio signals transmitted via the bus 100 to the processing unit 110.

For the captured audio, the processing unit 110 processes the audio using algorithms in the modules 145. In general, the endpoint 10 processes the near-end audio captured by the microphone 120 and the far-end audio received from the transmission interface 150 to reduce noise and cancel out acoustic echo that may occur between the captured audio. Ultimately, the processed audio can be sent to local and remote devices coupled to interfaces 150/160. In particular, the endpoint 10 uses the acoustic echo canceller 200 of FIG. 1 that can operate on the signal processor 110. The acoustic echo canceller 200 removes the echo signal from captured near-end signal that may be present due to the loudspeaker 130 in the conference environment.

As shown in FIG. 2, the microphone 120 uses an analog-to-digital (ADC) converter 122 that runs off of clock 124. The ADC 122 can correspond to, or can incorporate, the audio processing circuit (300) discussed below. The loudspeaker 130 uses a digital-to-analog (DAC) converter 132. When attempting to ameliorate the effects of distortion in the loudspeaker 130 audio, digital and analog gain of each component may need to be taken into account. The audio processing circuit (300) discussed below can serve to minimize noise in audio captured by microphone 120.

Figure 3:
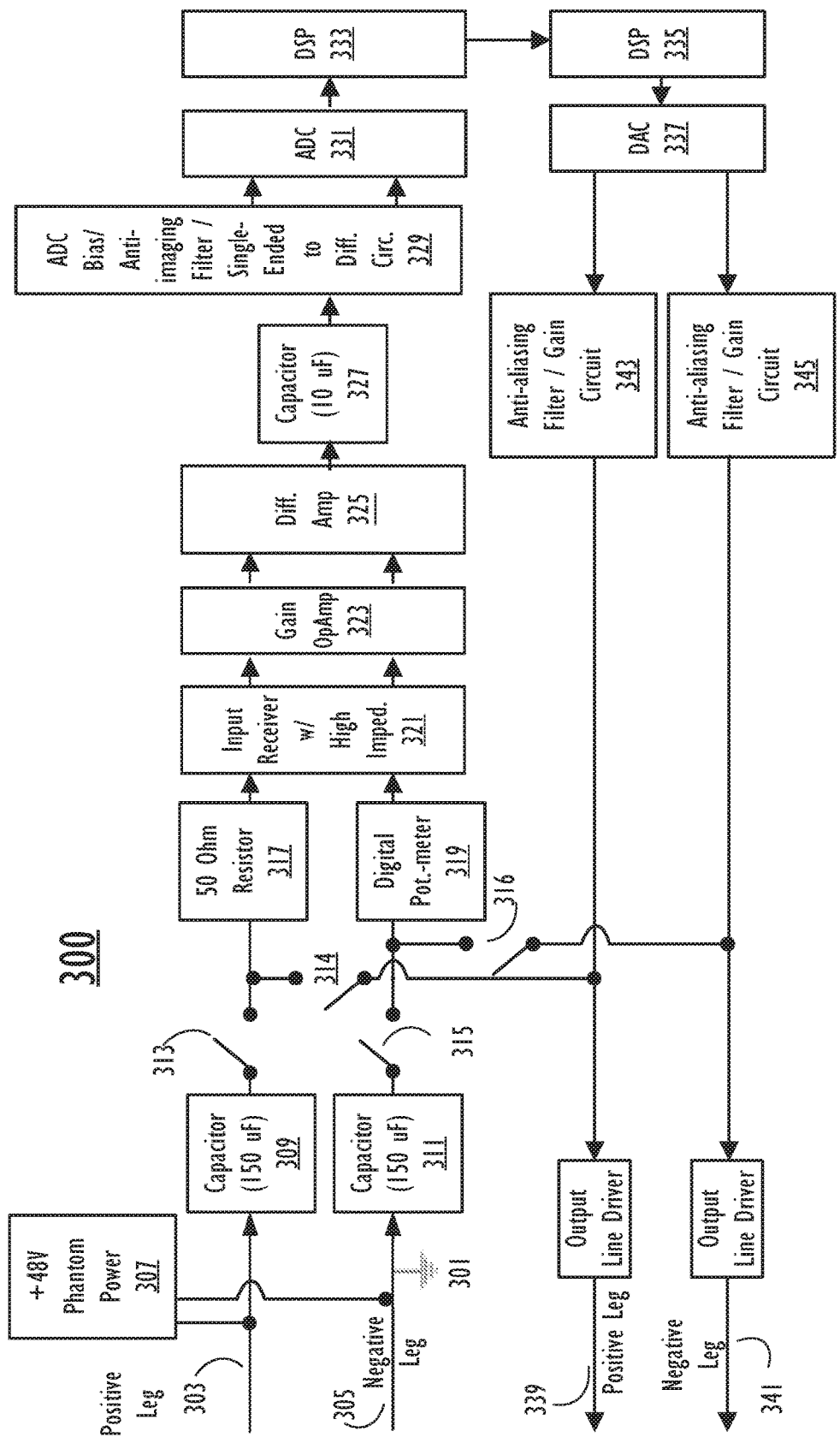
FIG. 3 illustrates an audio circuit, in accordance with an example of this disclosure.

FIG. 3 illustrates an audio processing circuit 300 in accordance with an example of this disclosure. Terminal 303 (positive) and terminal 305 (negative) are input terminals which would generally be connected to an input source such as a microphone, (see FIGS. 1-2). Terminal 339 (positive) and terminal 341 (negative) are the output terminals of the circuit 300. The signal source (e.g., microphone) outputs, for example, a 1 volt root mean square (1 Vrms) signal. Positive leg 303 and negative leg 305 are connected to (phantom) power source 307. Power source 307 is used to power an input microphone (not shown), however, the voltage from power source 307 must be blocked so that downstream components are not damaged. Positive leg 303 and negative leg 305 are connected to input capacitors 309 and 311, respectively. In one or more examples of this disclosure, the input leg 305 is grounded. For a balanced (differential) signal (e.g., from a microphone), input 305 is not grounded. For an unbalanced (single-ended) signal (e.g., from a line level source like a DVD player), input 305 would be grounded. For an unbalanced signal, power 307 would be disabled, and the digital potentiometer 319 would not have any effect on the signal. The output of capacitor 309 is connected to resistor 317 by switch 313. The output of capacitor 311 is connected to potentiometer 319 by switch 315. Switches 313 and 315 are closed during regular operation of circuit 300. (Switches 313 and 315 can be opened and switches 314 and 316 can be closed during testing.) The outputs of components 317 and 319 are, as shown passed to input receiver 321, gain operational amplifier 323, and differential amp 325. The output signal from differential amplifier 325 is fed to capacitor 327, which then goes to Filter 329. The output of filter 329 is input to ADC 331. The output of ADC 331 is then fed to DSP 333 and then DSP 335, (alternately, the functions of DSP 333 and DSP can be performed by a single DSP). The output of DSP 335 is input to DAC 337. The output of DAC 337 is then fed to anti-aliasing filter/gain circuit 343 and anti-aliasing filter/gain circuit 345. Anti-aliasing filter/gain circuit 343 feeds output positive leg 339, and anti-aliasing filter/gain circuit 345 feeds negative output leg 341.

In at least one example of this disclosure, audio processing circuit 300 can be implemented using a DSP 333, 335. In at least one example of this disclosure, audio processing unit 300 can be implemented using a field-programmable gate array.

Figure 4:
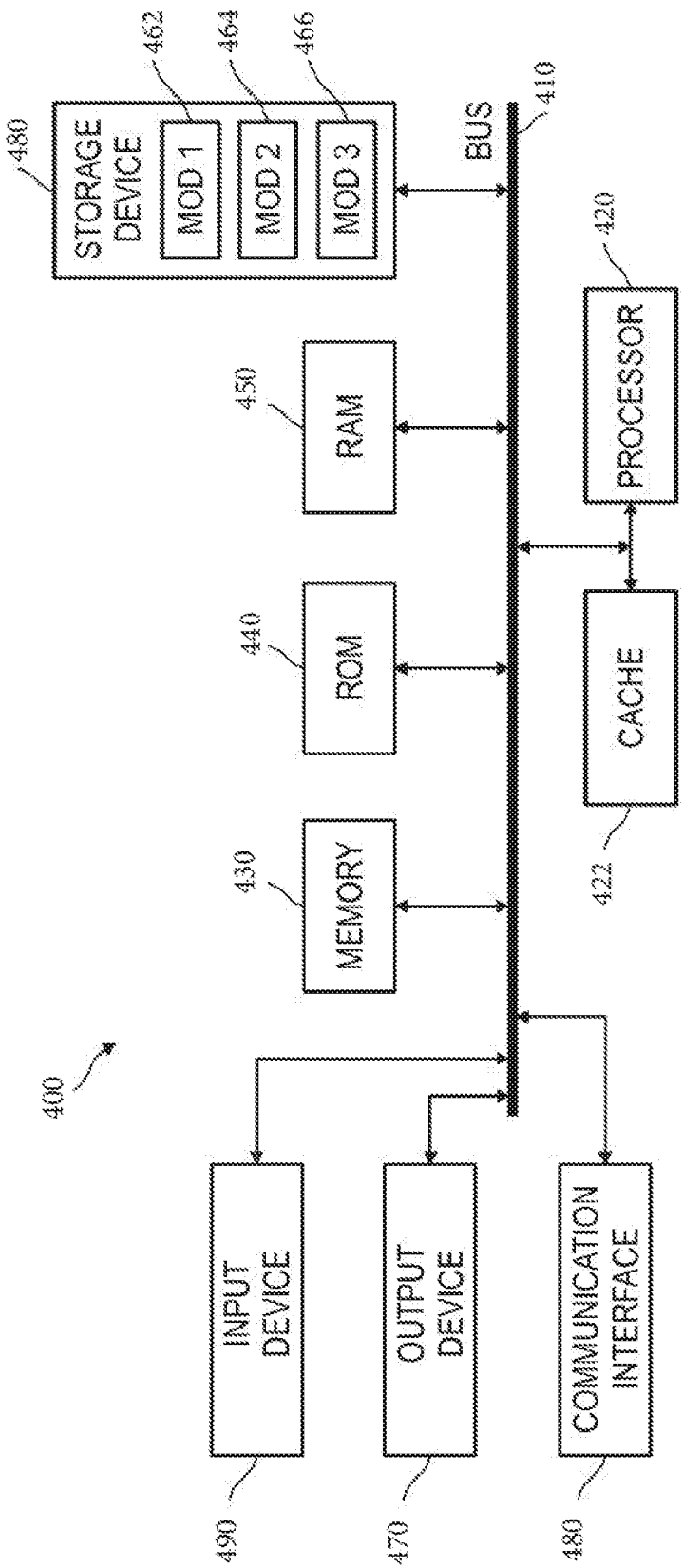
FIG. 4 illustrates an electronic device which can be employed to practice one or more concepts and methods of this disclosure.

FIG. 4 illustrates an electronic device 400 (such as endpoint 10) which can be employed to practice the concepts and methods described above. The components disclosed herein can be incorporated in whole or in part into tablet computers, personal computers, handsets and other devices utilizing one or more microphones. As shown, device 400 can include a processing unit (CPU or processor) 420 and a system bus 410 that couples various system components including the system memory 430 such as read only memory (ROM) 440 and random access memory (RAM) 450 to the processor 420. The processor can be a DSP (e.g., 333, 335, see FIG. 3.) The device 400 can include a cache 422 of high speed memory connected directly with, near, or integrated as part of the processor 420. The device 400 copies data from the memory 430 and/or the storage device 460 to the cache 422 for quick access by the processor 420. In this way, the cache provides a performance boost that avoids processor 420 delays while waiting for data. These and other modules can control or be configured to control the processor 420 to perform various actions. Other system memory 430 may be available for use as well. The memory 430 can include multiple different types of memory with different performance characteristics. The processor 420 can include any general-purpose processor and a hardware module or software module, such as module 1 (462), module 2 (464), and module 3 (466) stored in storage device 460, configured to control the processor 420 as well as a special-purpose processor where software instructions are incorporated into the actual processor design. The processor 420 may essentially be a completely self-contained computing system, containing multiple cores or processors, a bus, memory controller, cache, etc. A multi-core processor may be symmetric or asymmetric.

The system bus 410 may be any of several types of bus structures including a memory bus or memory controller, a peripheral bus, and a local bus using any of a variety of bus architectures. A basic input/output system (BIOS) stored in ROM 440 or the like, may provide the basic routine that helps to transfer information between elements within the device 400, such as during start-up. The device 400 further includes storage devices 460 such as a hard disk drive, a magnetic disk drive, an optical disk drive, tape drive or the like. The storage device 460 can include software modules 462, 464, 466 for controlling the processor 420. Other hardware or software modules are contemplated. The storage device 460 is connected to the system bus 410 by a drive interface. The drives and the associated computer readable storage media provide nonvolatile storage of computer readable instructions, data structures, program modules and other data for the device 400. In one aspect, a hardware module that performs a particular function includes the software component stored in a non-transitory computer-readable medium in connection with the necessary hardware components, such as the processor 420, bus 410, output device 470, and so forth, to carry out the function.

For clarity of explanation, the device of FIG. 4 is presented as including individual functional blocks including functional blocks labeled as a "processor" or processor 420. The functions these blocks represent may be provided using either shared or dedicated hardware, including, but not limited to, hardware capable of executing software and hardware, such as a processor 420, that is purpose-built to operate as an equivalent to software executing on a general-purpose processor. For example, the functions of one or more processors presented in FIG. 4 may be provided by a single shared processor or multiple processors. (Use of the term "processor" should not be construed to refer exclusively to hardware capable of executing software.) One or more examples of this disclosure include microprocessor and/or digital signal processor (DSP) hardware, read-only memory (ROM) 440 for storing software performing the operations discussed below, and random-access memory (RAM) 450 for storing results. Very large-scale integration (VLSI) hardware embodiments, as well as custom VLSI circuitry in combination with a general-purpose DSP circuit (333, 335), may also be provided.

Examples of this disclosure include:

Example 1. An audio circuit comprising: a first input terminal and a second input terminal; a first output terminal and a second output terminal; a positive leg running from the first input terminal to the first output terminal, the positive leg including a resistor; a negative leg running from the second input terminal to the second output terminal, the negative leg including a potentiometer; and a digital signal processor located, on the positive leg, between the resistor and the first output terminal, and on the negative leg, between the potentiometer and the second output terminal, the digital signal processor communicatively coupled to the potentiometer, wherein the digital signal processor is communicatively coupled to the potentiometer and configured to control the potentiometer to dynamically adjust a common mode rejection ratio of the audio circuit.

Example 2. The audio circuit of example 1, wherein the negative leg is grounded.

Example 3. The audio circuit of example 1, wherein the common mode rejection ratio is adjustable to a value exceeding sixty decibels when the audio circuit operates based on a signal between fifty-nine and sixty-one hertz.

Example 4. The audio circuit of example 1, wherein the common mode rejection ratio is adjustable to a value exceeding ninety decibels when the audio circuit operates based on a signal between fifty-nine and sixty-one hertz.

Example 5. The audio circuit of example 1, wherein the audio circuit is configured to have an input impedance greater than or equal to one Mega-ohm.

Example 6. The audio circuit of example 1, wherein the resistor has a resistance greater than or equal to fifty ohms.

Example 7. The audio circuit of example 1, wherein the potentiometer is a digital potentiometer.

Example 8. The audio circuit of example 1, wherein the audio circuit is configured to generate a forty-eight-volt voltage across the positive leg and the negative leg proximate the first input terminal and the second input terminal, the forty-eight-volt voltage operable to power one or more microphones when coupled to the first input terminal and second input terminal.

Example 9. A communications device, the communications device comprising: a microphone unit; an audio transmission unit; and an operational amplifier connecting the microphone unit to the audio transmission unit, the operational amplifier comprising: a first input terminal and a second input terminal, the first input terminal and the second input terminal coupled to the microphone unit; a first output terminal and a second output terminal, the first output terminal and a second output terminal coupled to the audio transmission unit; a positive leg running from the first input terminal to the first output terminal, the positive leg including a resistor; a negative leg running from the second input terminal to the second output terminal, the negative leg including a potentiometer; and a digital signal processor located, on the positive leg, between the resistor and the first output terminal, and on the negative leg, between the potentiometer and the second output terminal, the digital signal processor communicatively coupled to the potentiometer, wherein the digital signal processor is configured to control the potentiometer to dynamically adjust a common mode rejection ratio of the communications device.

Example 10. The communications device of example 9, wherein the negative leg is grounded to a local ground.

Example 11. The communications device of example 9, wherein the common mode rejection ratio is adjustable to a value exceeding sixty decibels when the operational amplifier operates based on a signal between fifty-nine and sixty-one hertz.

Example 12. The communications device of example 9, wherein the common mode rejection ratio is adjustable to a value exceeding ninety decibels when the operational amplifier operates based on a signal between fifty-nine and sixty-one hertz.

Example 13. The communications device of example 9, wherein the operational amplifier is configured to have an input impedance greater than or equal to one Mega-ohm.

Example 14. The communications device of example 9, wherein the resistor has a resistance greater than or equal to fifty ohms.

Example 15. The communications device of example 9, wherein the potentiometer is a digital potentiometer.

Example 16. The communications device of example 9, wherein the operational amplifier is configured to generate a forty-eight-volt voltage across the positive leg and the negative leg proximate the first input terminal and the second input terminal, the forty-eight-volt voltage operable to power the microphone unit.

Example 17. A system on a chip including an audio-visual processing circuit, wherein the audio-visual circuit comprises: a first input port and a second input port; a first output port and a second output port; a positive leg running from the first input port to the first output port, the positive leg including a resistor; a negative leg running from the second input port to the second output port, the negative leg including a potentiometer; and a digital signal processor located, on the positive leg, between the resistor and the first output port, and on the negative leg, between the potentiometer and the second output port, the digital signal processor communicatively coupled to the potentiometer, wherein the digital signal processor is communicatively coupled to the potentiometer and configured to control the potentiometer to dynamically adjust a common mode rejection ratio of the audio-visual circuit.

Example 18. The system on chip of example 17, wherein the negative leg is grounded.

Example 19. The system on chip of example 17, wherein the common mode rejection ratio is adjustable to a value exceeding sixty decibels when the audio-visual circuit operates based on a signal between fifty-nine and sixty-one hertz.

Example 20. The system on chip of example 17, wherein the common mode rejection ratio is adjustable to a value exceeding ninety decibels when the audio-visual circuit operates based on a signal between fifty-nine and sixty-one hertz.

The various examples described above are provided by way of illustration only and should not be construed to limit the scope of the disclosure. Various modifications and changes can be made to the principles and examples described herein without departing from the scope of the disclosure and without departing from the claims which follow.

The invention claimed is:

1. An audio circuit comprising:
a first positive input terminal and a second negative input terminal;
an input receiver having positive and negative inputs and positive and negative outputs;
a resistor having a first end coupled to the first positive input terminal and having a second end connected to the input receiver positive input;
a digital potentiometer having a first end coupled to the second negative input terminal, having a second end connected to the input receiver negative input and having a digital control input;
a difference amplifier having positive and negative inputs and an output, the difference amplifier positive input coupled to the input receiver positive output and the difference amplifier negative input coupled to the input receiver negative output;
a filter circuit having an input and having positive and negative outputs;
a capacitor connected in series between the difference amplifier output and the filter circuit input;
an analog to digital converter (ADC) having positive and negative inputs and a digital output, the ADC positive input coupled to the filter circuit positive output and the ADC negative input coupled to the filter circuit negative output; and
a digital signal processor (DSP) having a digital input coupled to the ADC digital output and having a digital output coupled to the digital potentiometer digital control input,
wherein the digital signal processor is configured to control the digital potentiometer to dynamically adjust a common mode rejection ratio of the audio circuit.

2. The audio circuit of claim 1, wherein the negative leg is grounded.

3. The audio circuit of claim 1, wherein the common mode rejection ratio is adjustable to a value exceeding sixty decibels when the audio circuit operates based on a signal between fifty-nine and sixty-one hertz.

4. The audio circuit of claim 1, wherein the common mode rejection ratio is adjustable to a value exceeding ninety decibels when the audio circuit operates based on a signal between fifty-nine and sixty-one hertz.

5. The audio circuit of claim 1, wherein the audio circuit is configured to have an input impedance greater than or equal to one Mega-ohm.

6. The audio circuit of claim 1, wherein the resistor has a resistance greater than or equal to fifty ohms.

7. The audio circuit of claim 1, wherein the DSP includes an audio digital output, the audio circuit further comprising:
a digital to analog convertor (DAC) having a digital input coupled to the DSP audio digital output and positive and negative outputs;
a first switch coupled in series between the first positive input terminal and the first end of the resistor;
a second switch coupled in series between the first negative input terminal and the first end of the digital potentiometer;
a third switch coupled to the DAC positive output and the first end of the resistor;
a fourth switch coupled to the DAC negative output and the first end of the digital potentiometer,
wherein the DSP is configured to perform the steps of:
opening the first and second switches and closing the third and fourth switches;
providing a digital signal providing a known audio signal to the DAC after opening the first and second switches and closing the third and fourth switches;
analyzing the common mode amplitudes of the audio circuit using the ADC digital output;
adjusting the value of the digital potentiometer based on the analysis; and
repeating the analyzing and adjusting steps to maximize the common mode rejection ratio of the audio circuit.

8. The audio circuit of claim 1, the audio circuit further comprising:
a direct current voltage source having a positive output connected to the first positive input terminal and a negative output connected to the second negative input terminal;
a first capacitor in series between the first positive input terminal and the first end of the resistor; and a second capacitor in series between the second negative input terminal and the first end of the digital potentiometer, wherein the direct current voltage is operable to power one or more microphones when coupled to the first input terminal and second input terminal.

9. A communications device, the communications device comprising:

a microphone unit;

an audio transmission unit; and an operational amplifier connecting the microphone unit to the audio transmission unit, the operational amplifier comprising:

a first input terminal and a second input terminal, the first input terminal and the second input terminal coupled to the microphone unit;

an input receiver having positive and negative inputs and positive and negative outputs;

a resistor having a first end coupled to the first input terminal and having a second end connected to the input receiver positive input;

a digital potentiometer having a first end coupled to the second input terminal, having a second end connected to the input receiver negative input and having a digital control input;

a difference amplifier having positive and negative inputs and an output, the difference amplifier positive input coupled to the input receiver positive output and the difference amplifier negative input coupled to the input receiver negative output;

a filter circuit having an input and having positive and negative outputs;

a capacitor connected in series between the difference amplifier output and the filter circuit input;

an analog to digital converter (ADC) having positive and negative inputs and a digital output, the ADC positive input coupled to the filter circuit positive output and the ADC negative input coupled to the filter circuit negative output; and a digital signal processor (DSP) having a digital input coupled to the ADC digital output and having a digital output coupled to the digital potentiometer digital control input, wherein the digital signal processor is configured to control the digital potentiometer to dynamically adjust a common mode rejection ratio of the communications device.

10. The communications device of claim 9, wherein the negative leg is grounded to a local ground.

11. The communications device of claim 9, wherein the common mode rejection ratio is adjustable to a value exceeding sixty decibels when the operational amplifier operates based on a signal between fifty-nine and sixty-one hertz.

12. The communications device of claim 9, wherein the common mode rejection ratio is adjustable to a value exceeding ninety decibels when the operational amplifier operates based on a signal between fifty-nine and sixty-one hertz.

13. The communications device of claim 9, wherein the operational amplifier is configured to have an input impedance greater than or equal to one Mega-ohm.

14. The communications device of claim 9, wherein the resistor has a resistance greater than or equal to fifty ohms.

15. The communications device of claim 9, wherein DSP includes an audio digital output, the audio circuit further comprising:

a digital to analog convertor (DAC) having a digital input coupled to the DSP audio digital output and positive and negative outputs;

a first switch coupled in series between the first positive input terminal and the first end of the resistor;

a second switch coupled in series between the first negative input terminal and the first end of the digital potentiometer;

a third switch coupled to the DAC positive output and the first end of the resistor;

a fourth switch coupled to the DAC negative output and the first end of the digital potentiometer, wherein the DSP is configured to perform the steps of:
opening the first and second switches and closing the third and fourth switches;
providing a digital signal providing a known audio signal to the DAC after opening the first and second switches and closing the third and fourth switches;
analyzing the common mode amplitudes of the audio circuit using the ADC digital output;
adjusting the value of the digital potentiometer based on the analysis; and
repeating the analyzing and adjusting steps to maximize the common mode rejection ratio of the audio circuit.

16. The communications device of claim 9, the audio circuit further comprising:

a direct current voltage source having a positive output connected to the first input terminal and a negative output connected to the second input terminal;

a first capacitor in series between the first input terminal and the first end of the resistor; and a second capacitor in series between the second input terminal and the first end of the digital potentiometer, wherein the direct current voltage is operable to power the microphone unit.

17. A method of operating an audio circuit, the audio circuit comprising:

a first positive input terminal and a second negative input terminal;

an input receiver having positive and negative inputs and positive and negative outputs;

a resistor having a first end coupled to the first positive input terminal and having a second end connected to the input receiver positive input;

a digital potentiometer having a first end coupled to the second negative input terminal, having a second end connected to the input receiver negative input and having a digital control input;

a difference amplifier having positive and negative inputs and an output, the difference amplifier positive input coupled to the input receiver positive output and the difference amplifier negative input coupled to the input receiver negative output;

a filter circuit having an input and having positive and negative outputs;

a capacitor connected in series between the difference amplifier output and the filter circuit input;

an analog to digital converter (ADC) having positive and negative inputs and a digital output, the ADC positive input coupled to the filter circuit positive output and the ADC negative input coupled to the filter circuit negative output; and a digital signal processor (DSP) having a digital input coupled to the ADC digital output and having a digital output coupled to the digital potentiometer digital control input, the method comprising the step of:
   controlling the digital potentiometer using the digital signal processor to dynamically adjust a common mode rejection ratio of the audio circuit.

18. The method of claim 17, wherein the DSP includes an audio digital output and the audio circuit further comprises:
   a digital to analog convertor (DAC) having a digital input coupled to the DSP audio digital output and positive and negative outputs;
   a first switch coupled in series between the first positive input terminal and the first end of the resistor;
   a second switch coupled in series between the first negative input terminal and the first end of the potentiometer is a digital potentiometer;
   a third switch coupled to the DAC positive output and the first end of the resistor;
   a fourth switch coupled to the DAC negative output and the first end of the digital potentiometer,
   wherein the step of controlling the digital potentiometer comprises the steps of:
      opening the first and second switches and closing the third and fourth switches;
      providing a digital signal providing a known audio signal to the DAC after opening the first and second switches and closing the third and fourth switches;
      analyzing the common mode amplitudes of the audio circuit using the ADC digital output;
      adjusting the value of the digital potentiometer based on the analysis; and
      repeating the analyzing and adjusting steps to maximize the common mode rejection ratio of the audio circuit.

19. The method of claim 18, wherein the step of controlling the digital potentiometer comprises the step of:
   closing the first and second switches and opening the third and fourth switches after the common mode rejection ratio has been maximized.

20. The method of claim 18, wherein the step of analyzing the common mode amplitudes of the audio circuit using the ADC digital output includes performing a Fast Fourier Transform.

* * * * *